US010416570B2

(12) United States Patent
Kugler et al.

(10) Patent No.: US 10,416,570 B2
(45) Date of Patent: Sep. 17, 2019

(54) OPTICAL IMAGING ARRANGEMENT WITH A PIEZOELECTRIC DEVICE

(71) Applicant: Carl Zeiss SMT GmbH, Oberkochen (DE)

(72) Inventors: Jens Kugler, Aalen (DE); Stefan Hembacher, Bobingen (DE); Michaela Schmid, Kaltenbach (CH); Bernhard Geuppert, Aalen (DE); Burkhard Corves, Hergenrath (BE); Martin Riedel, Augsburg (DE); Martin Wahle, Munich (DE); Mathias Huesing, Aachen (DE); Michael Lorenz, Aachen (DE); Tim Detert, Aachen (DE); Marwène Nefzi, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/204,519

(22) Filed: Nov. 29, 2018

(65) Prior Publication Data

US 2019/0094705 A1 Mar. 28, 2019

Related U.S. Application Data

(63) Continuation of application No. PCT/EP2016/062138, filed on May 30, 2016.

(51) Int. Cl.
*G03F 7/20* (2006.01)
*G02B 7/182* (2006.01)
*G02B 7/02* (2006.01)

(52) U.S. Cl.
CPC ......... *G03F 7/70258* (2013.01); *G02B 7/023* (2013.01); *G02B 7/182* (2013.01);
(Continued)

(58) Field of Classification Search
CPC ............. G03F 7/70258; G03F 7/70825; G03F 7/70191; G02B 7/182; G02B 7/023; G02B 7/1827; G02B 7/1828
See application file for complete search history.

(56) References Cited

U.S. PATENT DOCUMENTS 5,204,712 A * 4/1993 Bouwer ................ B23Q 1/36
 355/53
5,822,133 A * 10/1998 Mizuno .................... G02B 3/14
 359/696

(Continued)

FOREIGN PATENT DOCUMENTS

EP 1 471 390 A2 10/2004
WO WO 2015/158487 10/2015

OTHER PUBLICATIONS

International Search Report and Written Opinion for corresponding PCT Appl No. PCT/EP2016/062138, dated Feb. 9, 2017.

*Primary Examiner* — Deoram Persaud
(74) *Attorney, Agent, or Firm* — Fish & Richardson P.C.

(57) ABSTRACT

An optical imaging arrangement includes an optical element unit, and an actuator device connected to the optical element unit and is configured to be connected to a support structure for supporting the optical unit. The actuator device is configured to: actively adjust, in an adjustment state, a position and/or an orientation of the optical unit with respect to the support structure in N degrees of freedom; and support the optical element unit in a statically overdetermined manner in at least one of the N degrees of freedom via a plurality of active first and second actuator components such that, in a holding state following the adjustment state, the first and second actuator components cause a parasitic residual load introduced into the optical element unit in the at least one of the N degrees of freedom.

20 Claims, 4 Drawing Sheets

(52) U.S. Cl.
CPC ....... *G02B 7/1827* (2013.01); *G03F 7/70191* (2013.01); *G03F 7/70825* (2013.01)

(56) References Cited

U.S. PATENT DOCUMENTS

| | | | | |
|---|---|---|---|---|
| 6,333,776 | B1* | 12/2001 | Taniguchi | G03F 7/70091 355/52 |
| 6,870,632 | B2* | 3/2005 | Petasch | G02B 7/023 356/614 |
| 7,110,089 | B2* | 9/2006 | Mizuno | G02B 7/023 310/328 |
| 7,692,884 | B2* | 4/2010 | Ishikawa | G02B 7/1827 359/811 |
| 9,829,808 | B2* | 11/2017 | Kwan | G03F 7/70825 |
| 2002/0163741 | A1* | 11/2002 | Shibazaki | G02B 7/022 359/819 |
| 2003/0197914 | A1* | 10/2003 | Cox | G03F 7/70141 355/53 |
| 2003/0234989 | A1* | 12/2003 | Oshino | G02B 7/00 359/811 |
| 2004/0214483 | A1* | 10/2004 | Mizuno | G02B 7/027 439/894 |
| 2004/0263812 | A1* | 12/2004 | Hummel | G03F 7/70258 355/53 |
| 2005/0078386 | A1* | 4/2005 | Takabayashi | G02B 7/022 359/819 |
| 2005/0190462 | A1* | 9/2005 | Rau | G02B 7/023 359/819 |
| 2007/0076310 | A1* | 4/2007 | Sakino | G02B 7/183 359/819 |
| 2007/0280609 | A1* | 12/2007 | Ito | G02B 7/003 385/94 |
| 2007/0284502 | A1* | 12/2007 | Hsin | G02B 7/005 248/495 |
| 2008/0100894 | A1* | 5/2008 | Asada | G02B 7/1827 359/198.1 |
| 2008/0117397 | A1* | 5/2008 | Weber | G02B 7/003 355/53 |
| 2009/0021847 | A1* | 1/2009 | Nawata | G02B 7/005 359/811 |
| 2009/0050776 | A1* | 2/2009 | Muehlbeyer | G02B 7/182 248/495 |
| 2009/0135395 | A1* | 5/2009 | Melzer | G02B 7/023 355/67 |
| 2009/0225297 | A1* | 9/2009 | Bleidistel | G02B 7/023 355/67 |
| 2009/0237793 | A1* | 9/2009 | Koo | G02B 27/646 359/555 |
| 2010/0195085 | A1* | 8/2010 | Fuse | G03B 27/58 355/74 |
| 2010/0201964 | A1* | 8/2010 | Kugler | G02B 7/023 355/67 |
| 2016/0054661 | A1 | 2/2016 | Bleidistel et al. | |

* cited by examiner

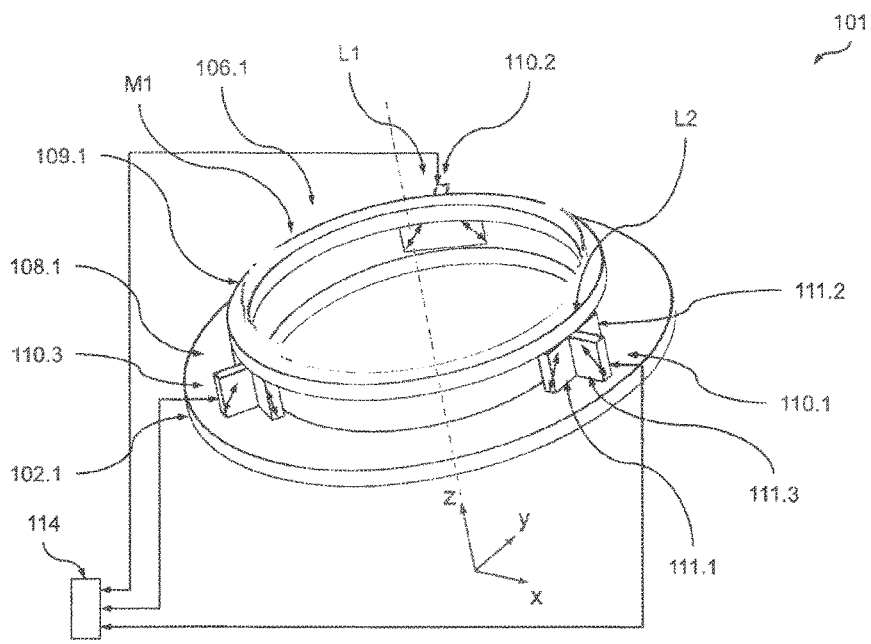
Fig. 2
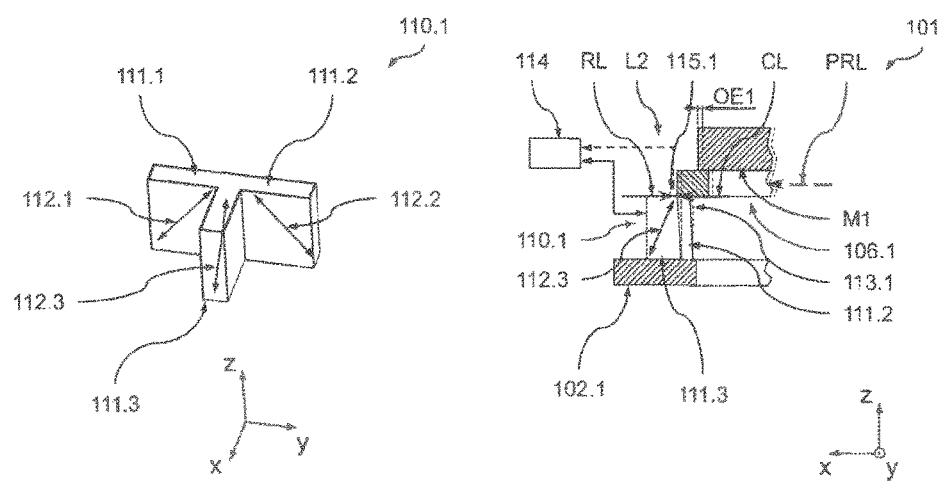
Fig. 3
Fig. 4

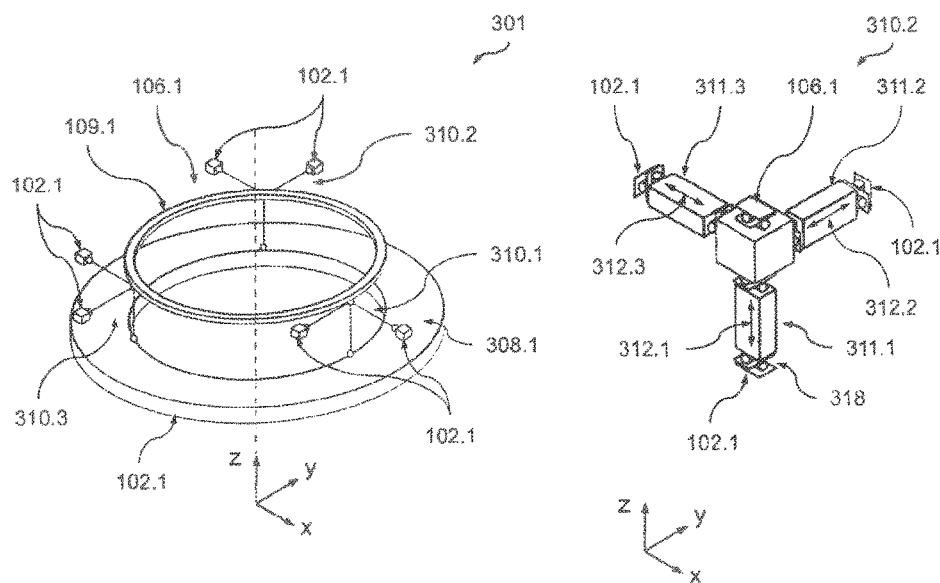
Fig. 9          Fig. 10
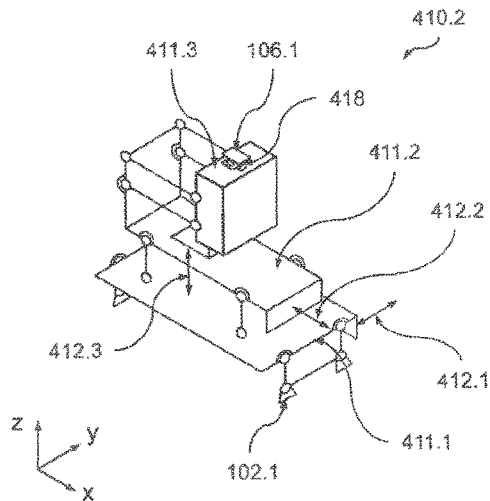            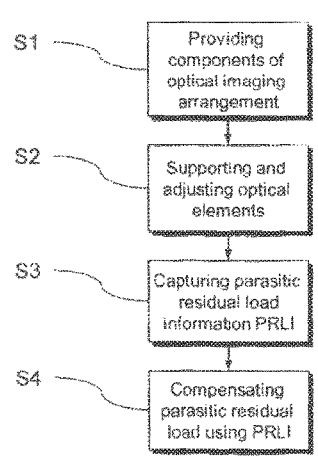
Fig. 11          Fig. 12

OPTICAL IMAGING ARRANGEMENT WITH A PIEZOELECTRIC DEVICE

CROSS-REFERENCE TO RELATED APPLICATIONS

The present application is a continuation of, and claims benefit under 35 USC 120 to, international application PCT/EP2016/062138, filed May 30, 2016. The entire disclosure of this application is incorporated by reference herein.

FIELD

The disclosure relates to optical imaging arrangements used in exposure and inspection processes, in particular to optical imaging arrangements of microlithography systems. It further relates to methods of supporting optical element units of such optical imaging arrangement as well as optical imaging methods. The disclosure may be used in the context of photolithography processes for fabricating microelectronic devices, in particular semiconductor devices, or in the context of fabricating devices, such as masks or reticles, used during such photolithography processes as well as for optical inspection processes used in this context.

BACKGROUND

Typically, the optical systems used in the context of fabricating microelectronic devices such as semiconductor devices include a plurality of optical element units including optical elements, such as lenses and mirrors etc., arranged in the exposure light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually include an external generally ring shaped support device supporting one or more optical element holders each, in turn, holding an optical element.

Due to the ongoing miniaturization of semiconductor devices there is, however, a permanent need for enhanced resolution of the optical systems used for fabricating those semiconductor devices. This need for enhanced resolution obviously pushes the need for an increased numerical aperture (NA) and increased imaging accuracy of the optical system.

One approach to achieve enhanced resolution is to reduce the wavelength of the light used in the exposure process. In the recent years, approaches have been taken using light in the extreme ultraviolet (EUV) range, typically using wavelengths ranging from 5 nm to 20 nm, in most cases about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the desired accuracy properties is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above can lead to very strict desired properties with respect to the relative position between the components participating in the exposure process as well as the deformation of the individual components. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the optical imaging arrangement components, i.e. the mask, the optical elements and the wafer, for example, cooperating in the exposure process are supported in a well-defined manner in order to maintain a predetermined spatial relationship between the optical imaging arrangement components and to provide minimum undesired deformation caused by parasitic residual loads as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), as well as the under the influence of thermally induced position alterations, it is desirable to at least intermittently capture the spatial relationship between certain components of the optical imaging arrangement and to actively adjust the position and/or orientation of at least one of the components of the optical imaging arrangement as a function of the result of this capturing process.

Generally, two different concepts are known for achieving such active adjustment. One is the so-called active support using contactless force actuators, e.g. so-called Lorentz actuators, generating a defined support force as a function of a given input signal. While these force actuators have clear advantages in terms of their dynamic properties as well as the comparatively low parasitic residual loads on the optical components, they involve a fairly complex support structure as well as sophisticated and expensive control layout. Moreover, they are susceptible to aging effects and they constantly have to be provided with power. As a result, they generate heat which has to be removed from the system in order to avoid thermally induced deformation of the optical components and, ultimately, deterioration of the imaging quality obtained.

Another approach to achieve such active adjustment is the so-called semi-active support using displacement actuators, such as e.g. piezoelectric actuators, generating a defined displacement as a function of a given input signal. Such semi-active supports have the advantage that they are comparatively cheap to implement, involve less sophisticated control, show very little aging effects and generate way less heat compared to the above active concepts using force actuators.

Typically, such displacement actuators are used in so-called hexapod arrangements, usually formed by three bipods distributed at the circumference of the optical component to be supported. These hexapod arrangements, thanks to a sufficiently well decoupling linkage to the optical component and the support structure, respectively, provide statically determined support (often also referred to as isostatic support) of the supported the optical component with comparatively low residual parasitic loads introduced into the optical component.

As a result of the soft decoupling linkage, however, the rigidity of the support system also is comparatively low in certain degrees of freedom, typically in the translational degrees of freedom lying in the support plane defined by the hexapod. This is in many cases undesirable under dynamic aspects.

SUMMARY

The disclosure seeks, at least to some extent, to overcome the above disadvantages and to provide good and long term reliable imaging properties of an optical imaging arrangement used in an optical imaging process.

The disclosure also seeks to reduce the effort for an optical imaging arrangement while at least maintaining the imaging accuracy of the optical imaging arrangement used in an exposure process, especially under increasingly stricter dynamic properties.

According to one aspect, the disclosure is based on the technical teaching that an overall reduction of the effort for an optical imaging arrangement while at least maintaining the imaging accuracy of the optical imaging arrangement may be achieved under increasingly stricter dynamic properties if a support concept with active statically overdetermined support in specific degrees of freedom is selected.

Here, undesired potential residual parasitic loads on the optical element unit (resulting from its statically overdetermined support) are at least partially, preferably substantially fully, compensated by the active support via one or more additional, redundant actuator components. Hence, on the one hand, imaging errors resulting from such residual parasitic loads acting on the optical element units may at least largely be avoided.

Furthermore, thanks to the statically overdetermined support, the rigidity of the support is increased in a beneficial manner in the respective degree of freedom (where static overdetermination is provided by the additional, redundant actuator component). This is particularly beneficial in terms of the dynamic properties of the system. It will be appreciated that, statically overdetermined support may be provided in any desired number of degrees of freedom up to all six degrees of freedom in space. Typically, as a function of the optical imaging process to be performed and the sensitivity of the imaging error of this process to vibration in specific degrees of freedom, statically overdetermined support may be limited to certain degrees of freedom, where relevant sensitivity of the imaging error exists, while static overdetermination may be omitted in other, less sensitive degrees of freedom.

It has been shown that, typically, the rigidity in the respective degree of freedom with static overdetermination may be increased at least by a factor of 1.3 while at the same time keeping the parasitic residual loads low (even without active compensation). In particular, even without active compensation, the increase in the parasitic residual loads may be kept below a factor of 2. In particular, an increase in the rigidity in the respective degree of freedom by a factor of 1.5, even a factor of 2.0 is feasible as will be explained in greater detail below.

The present disclosure, in particular, allows implementing so-called semi-active solutions as they have been outlined above with their benefits regarding cost, simple control, low power consumption and low thermal impact. At the same time, parasitic residual load compensating control of the respective active redundant actuator component allows eliminating the drawbacks of such semi-active solutions, such as their generally low rigidity (when low parasitic loads are desired) or their generally high parasitic loads (when high rigidity of the support is desirable).

Thus, according to a first aspect of the disclosure there is provided an optical imaging arrangement including an optical element unit, and an actuator device. The actuator device is connected to the optical element unit and is configured to be connected to a support structure for supporting the optical unit. The actuator device is configured to actively adjust, in an adjustment state, a position and/or an orientation of the optical unit with respect to the support structure in N degrees of freedom. The actuator device is configured to support the optical element unit in a statically overdetermined manner in at least one of the N degrees of freedom via a plurality of active first and second actuator components such that, in a holding state following the adjustment state, the first and second actuator components cause a parasitic residual load introduced into the optical element unit in the at least one of the N degrees of freedom. The actuator device includes an active third actuator component configured to at least partially compensate, in a parasitic residual load compensation state, the parasitic residual load introduced into the optical element unit in the at least one of the N degrees of freedom.

It will be appreciated that at least partial active compensation of the parasitic residual load may be achieved in any suitable way by introducing compensating loads at any desired and suitable location of the optical imaging arrangement unit and/or the actuator device. For example, compensating loads may be introduced at any desired and suitable location of the optical element unit. Preferably, however, compensating loads are introduced at least in the vicinity of the location where the parasitic residual load is introduced into the optical element unit.

Hence, with preferred embodiments, an active first actuator component of the plurality of first and second actuator components is configured to act on the optical element unit at a first location to generate a first excursion of the optical element unit in at least one first degree of freedom of the N degrees of freedom. An active second actuator component of the plurality of first and second actuator components is configured to act on the optical element unit at a second location to generate a second excursion of the optical element unit in at least one second degree of freedom of the N degrees of freedom, the second location being located at a distance from the first location and the second degree of freedom being different from the first degree of freedom. The second actuator component, at the first excursion, undergoes an elastic deflection generating the parasitic residual load introduced into the optical element unit at the second location. The third actuator component is configured to act on the optical element unit at the second location to at least partially compensate the parasitic residual load introduced into the optical element unit. Hence, in other words, compensation of the parasitic residual load is provided in a beneficial way in the same area in which the parasitic residual load would otherwise be introduced into the optical element unit. Hence, the introduction of stresses resulting from the parasitic load and the compensating load, respectively, into the optical element unit may be at least largely avoided.

It will be appreciated that the actuator device may be configured in any desired and suitable way providing proper active support and residual parasitic load compensation. With certain embodiments, the actuator device includes at least one actuator unit integrating one of the first and second actuator components and the third actuator component, the actuator unit having a first end connected to the optical element unit and a second end to be connected to the support structure. The actuator components of the respective actuator unit may be arranged in any desired and suitable way. For example, the actuator components of the actuator unit may be arranged kinematically in series (i.e. in a so-called open kinematic chain arrangement) between the first end and the second end of the actuator unit. As an alternative, the actuator components may be arranged kinematically parallel (i.e. in a so-called closed kinematic chain arrangement) between the first end and the second end of the actuator unit.

With certain embodiments, the actuator unit includes at least two actuator elements arranged kinematically in series between the first end and the second end of the actuator unit. In addition or as an alternative, the actuator unit may include at least two actuator elements arranged kinematically parallel between the first end and the second end of the actuator unit. Any of these cases may have its advantages in terms of flexibility of the arrangement of the components.

With further embodiments, the actuator unit may include a first actuator element and a second actuator element forming one of the first and second actuator components. For example, particularly simple designs may be achieved if the first and second actuator elements form of a bipod. Moreover, preferably, the actuator unit may include an actuator element forming the third actuator component. By this approach, particularly compact and simple configurations may be achieved.

Connection of the components of the actuator unit to the optical element unit and the support structure, respectively, may take place in any suitable and desired way. Preferably, the actuator unit includes at least one decoupling link at the first end and/or the second end, which provides proper decoupling in the relevant degrees of freedom, in which, otherwise, parasitic loads would be generated. Preferably, the at least one decoupling link is formed in the manner of a ball joint or a cardan joint. By this approach, in particular when linear actuators are used, proper decoupling may be achieved in the degrees of freedom other than the degree of freedom where actuation is provided. The decoupling links may be executed in any desired and suitable way. Preferably, elastic solid body links, also referred to as flexures, are used thanks to their advantages in terms of providing frictionless motion.

With further embodiments, the actuator unit includes a first actuator element, a second actuator element and a third actuator element. Here, the first actuator element is configured to provide actuation in a first direction of actuation, the second actuator element is configured to provide actuation in a second direction of actuation, and the third actuator element is configured to provide actuation in a third direction of actuation. Furthermore, at least two of the first, second and third directions of actuation are mutually inclined with respect to each other, in particular, mutually perpendicular with respect to each other. By this approach, in a very simple manner, the respective direction of actuation may be assigned to specific degrees of freedom, in which the optical element unit has to be adjusted.

With certain embodiments, the first actuator element and the second actuator element are arranged in the manner of a bipod forming one of the first and second actuator components. By this approach, very simple and robust mechanical configurations achieved. This particularly applies with further embodiments, where the first, second and third actuator elements are arranged in the manner of a tripod.

It will be appreciated that, basically, any desired and suitable spatial arrangement of the actuator components may be provided, in particular, as a function of the number of degrees of freedom in which active adjustment has to be provided and/or as a function of the degrees of freedom in which the imaging accuracy of the optical imaging process to be performed is sensitive to parasitic residual loads. With certain embodiments, the actuator device includes a first actuator unit integrating the first actuator component and the actuator device includes a second actuator unit integrating the second actuator component and the third actuator component. The first actuator unit and the second actuator unit are mutually spaced along a circumference of the optical element unit. Each of the first and second actuator units includes a first actuator element, a second actuator element and a third actuator element, and each of the actuator elements is configured to provide actuation in a direction of actuation. Furthermore, in a neutral state, the directions of actuation of the first actuator elements are at least substantially parallel and/or the directions of actuation of the second actuator elements are at least substantially parallel and/or the directions of actuation of the third actuator elements are at least substantially parallel.

Such a solution has the advantage that each pair of parallel directions of actuation may define a degree of freedom of actuation of the optical element unit, actuation in which (if at all) involves only minimum parasitic motion in other degrees of freedom, which otherwise would lead to parasitic deformation at the interface between the respective actuator unit and the optical element unit and, ultimately, to the introduction of parasitic loads into the optical element unit. For example, translational motion introduced into the optical element unit by the two actuator units in two such parallel directions of actuation, in a beneficial manner, (if at all) will only result in minimum parasitic rotation of the optical element unit in the plane defined by the two parallel directions of actuation. Hence, ultimately, with all three pairs of directions of actuation being mutually parallel, overall parasitic motion in other degrees of freedom (than the ones defined by the pairs of directions of actuation) may be minimized. This in a beneficial manner also minimizes parasitic load exerted on the optical element unit due to such parasitic motions.

It will be appreciated that any desired number of actuator units may be provided, in particular, as a function of the degrees of freedom in which actuation has to be provided.

With certain embodiments, the actuator device includes a first actuator unit, a second actuator unit and a third actuator unit, wherein the first, second and third actuator units are distributed and mutually spaced, in particular, substantially evenly spaced, along a circumference of the optical element unit. Each of the first, second and third actuator units includes a first actuator element, a second actuator element and a third actuator element, wherein each of the actuator elements is configured to provide actuation in a direction of actuation. Furthermore, in a neutral state, the directions of actuation of the first actuator elements are at least substantially parallel and/or the directions of actuation of the second actuator elements are at least substantially parallel and/or the directions of actuation of the third actuator elements are at least substantially parallel. By this approach, particularly stable and simple three-point support may be provided to the optical element unit.

With certain embodiments, the actuator device includes a first actuator unit, a second actuator unit and a third actuator unit, wherein the first, second and third actuator units are distributed and mutually spaced, in particular, substantially evenly spaced, along a circumference of the optical element unit. Each of the first, second and third actuator units includes a first actuator element, a second actuator element and a third actuator element, wherein the first and second actuator elements of the first, second and third actuator units are configured to support the optical element unit in the manner of a hexapod. Here, the third actuator elements of the first, second and third actuator units are configured to at least partially compensate parasitic residual loads introduced into the optical element unit as a result of parasitic elastic deflection of the first and second actuator elements. By this approach, a particularly simple and good reduction of the parasitic residual loads introduced into the optical element unit may be achieved. With embodiments of particularly simple yet robust design, the first, second and third actuator elements of at least one of the first, second and third actuator units may be arranged in the manner of a tripod.

It will be appreciated that, in many cases, the compensating load introduced by the third actuator component in a specific direction may be introduced into the optical element by active actuation in this specific direction. With further embodiments, the compensating load may also be generated at least partially by the elastic resetting force and/or moment resulting from elastic deformation of at least a part of the third actuator component.

For example, with certain embodiments, the third actuator component includes a connecting element and an active locking unit. The connecting element is connected to the optical element unit and/or one of the first and second actuator components. The locking unit is configured to be connected to the support structure and to selectively release the connecting element for displacement in a released state and lock the connecting element against displacement in a locked state. A control device of the actuator device is configured to control the locking unit such that, during the adjustment state, the connecting element is released for displacement, and the connecting element is locked against displacement in the parasitic residual load compensation state.

It will be appreciated that, with other embodiments, a kinematically inverted arrangement may as well be selected, where the locking unit is connected to the optical element unit and/or one of the first and second actuator components, while the connecting element is connected to the support structure.

These solutions have the great advantage that the third actuator component may be designed as a fairly simple component, which, in particular, doesn't require a large range of actuation motion. In particular, the range of actuation motion may be way smaller than the range of actuation of the first and second actuator components (actually generating the motion of the optical element unit). In particular, the range of actuation motion of the third actuator component only needs to ensure proper locking and unlocking of the locking unit.

Moreover, control of the third actuator component, more precisely, control of the locking unit, only has to be synchronized to the control of the first and second actuator component as regards the locking and unlocking of the locking unit. During the adjustment state, control of the (then unlocked) locking unit may be inactive. Hence, control of the third actuator component may be a simple switching on and off, respectively, of the locking unit, which only has to be sufficiently well synchronized to the beginning and end of the adjustment state.

It will be appreciated that the elastic deformation of the third actuator component, typically, of the locking unit and/or the connecting element, may be achieved in at least one of two ways. A first option is to apply a certain over-actuation of the first and/or second actuator component beyond the setpoint adjustment of the optical element unit, then lock the locking device and, subsequently, remove the over-actuation, such that the optical element unit returns to the setpoint adjustment. During this return to the setpoint adjustment, the locked locking unit and/or the connecting element are then elastically deformed to build up the compensating load. It will be appreciated that the amount of over-actuation is selected as a function of the rigidity of the locking unit and the connecting element in the direction of over-actuation. Hence, the higher this rigidity the smaller the amount of over-actuation has to be.

A second option for generating the elastic deformation is that the locking unit and/or the connecting element is configured to generate, in the locked state, a compensation load transmitted via the connecting element to at least partially compensate the parasitic residual load. For example, the locking unit and/or the connecting element may be active devices which, under the control of the control device, actively generate the compensation load. To this end, for example, the locking unit (in its locked state) may be configured to apply the elastic deformation to the connecting element. Here as well, as a function of the rigidity of the locking unit and the connecting element in the direction of actuation, only a comparatively small range of actuation may be desirable to generate the compensating load.

It will be appreciated that the actuator elements used to generate the respective motion as outlined above may be of any desired and suitable design. For example, for at least some of the actuations as outlined above, so-called force actuators (generating a defined force as a function of an input signal) may be implemented. With certain embodiments, at least one of the actuator elements is configured in the manner of a displacement actuator generating defined displacement as a function of an input signal.

Furthermore, any desired actuator generating any desired type of motion may be used. In particular, actuators generating rotational motion may be used. With certain embodiments yielding particularly simple configurations, the actuator element is configured as a linear actuator generating translational motion as a function of an input signal.

Moreover, with certain embodiments, so-called Lorentz actuators may be used. However, with certain particularly robust and thermally advantageous embodiments, the actuator element includes a piezoelectric element.

It will be appreciated that, basically, any desired and suitable control concept may be used for controlling the actuator device to achieve parasitic load compensation. For example, an open loop control may be used to provide the adjustments for such parasitic load compensation. With certain embodiments however, a closed loop control concept is implemented. To this end, preferably, at least one parasitic load sensor device is provided, wherein the parasitic load sensor device is configured to capture parasitic residual load information representative of the parasitic residual load introduced into the optical element unit in the at least one of the N degrees of freedom. By this approach, a particularly simple control can be achieved.

The parasitic load sensor device preferably captures the parasitic residual load information in the area of a location, where one of the first and second actuator components is connected to the optical element. By this approach, particularly exact determination of the parasitic residual load may be achieved.

To obtain appropriate control, the parasitic load sensor device may provide the parasitic residual load information to a control device of the actuator device, the control device being configured to control the third actuator component as a function of the parasitic residual load information to at least partially compensate the parasitic residual load. By this approach, particularly simple yet efficient control may be achieved.

The parasitic residual load information may be obtained in any desired and suitable way. With preferred embodiments, the parasitic load sensor device includes a force sensor and/or a deformation sensor, either yielding suitable and reliable parasitic residual load information in a particularly simple manner. In particular, with a certain embodiments using one or more piezoelectric elements for the third actuator component, such a piezoelectric element may also be used as the parasitic load sensor device.

One of the particular advantages of the present support concept with statically overdetermined support is that, while parasitic residual loads are effectively reduced or minimized, respectively, the overall rigidity of the support system (in the at least one of the N degrees of freedom) is increased in a beneficial way via the third actuator component. Basically, any increase in the rigidity of the support is helpful and welcome. Preferably, however, the third actuator component increases a rigidity of the actuator device in the at least one of the N degrees of freedom by a factor of 1.2 to 3, preferably 1.3 to 2, more preferably 1.3 to 1.5. By this approach, particularly beneficial results are achieved at comparatively low expense. Particularly beneficial results are achieved if the actuator device is configured to provide semi-active support of the optical unit on the support structure.

The following can be noted as a general rule for the respective maximum increase in the rigidity of the actuator device in the respective degree of freedom. If, for example, starting from a configuration where the statically determined support is provided by a hexapod support (e.g. a support by three bipods distributed at the circumference of the optical element unit), each bipod of the hexapod is added by M additional strut elements (which are non-co-planar with the respective bipod), the respective maximum increase factor IFM of the rigidity in the respective calculates as:

$$IFM = \frac{6 + 3 \cdot M}{6}. \quad (1)$$

Hence, for example, in case each bipod is added by one further strut element (i.e. M=1) to yield a support of the optical element unit by three tripods, the increase maximum increase factor IFM in the respective degree of freedom calculates as IFM=1.5 (in case of mutually orthogonal strut elements of the respective tripod). It will be appreciated that less or more additional strut elements may be added. While, theoretically, no upper limit is given for the number of additional strut elements, typically, the number of additional strut elements is limited by the building space available for their integration within the optical imaging arrangement.

It will be appreciated that the optical imaging arrangement may be used in the context of any desired optical imaging process at any desired imaging wavelength. Particularly beneficial results may be achieved in the context of optical imaging arrangements configured to be used in microlithography using exposure light at an exposure light wavelength in a UV range, in particular, an EUV range. Hence, preferably, the exposure light has an exposure light wavelength ranging from 5 nm to 20 nm.

Preferably, the optical imaging arrangement includes an illumination unit, a mask unit, an optical projection unit and a substrate unit. The illumination unit is configured to illuminate a mask received by the mask unit with the exposure light. The optical projection unit is configured to transfer an image of a pattern formed on the mask onto a substrate received by the substrate unit. The optical element then may form part of either of the illumination unit and the optical projection unit.

The optical element unit, typically, includes an optical element, in particular, a reflective optical element. It will be appreciated that, eventually, the optical element unit may exclusively be formed by such an optical element. With other embodiments, the optical element unit may also include further components, such as, for example, a holder or the like, holding the optical element.

It will be appreciated that parasitic residual load compensation may be provided in any desired number of degrees of freedom. Typically, such parasitic residual load compensation may be limited to those degrees of freedom, in which a noticeable sensitivity of the imaging accuracy of the optical imaging process exists with respect to such parasitic residual loads. The respective degree of freedom in which parasitic residual load compensation is provided may, for example, be a rotational degree of freedom. In many cases, however, the optical imaging process is particularly sensitive to parasitic residual loads in translational degrees of freedom. Hence, preferably, the at least one of the N degrees of freedom is a translational degree of freedom. Furthermore, preferably, N ranges from 1 to 6, preferably from 2 to 6, more preferably from 4 to 6. According to a second aspect of the disclosure there is provided an optical imaging arrangement including an optical element unit and an actuator device. The actuator device is connected to the optical element unit and is configured to be connected to a support structure for supporting the optical unit. The actuator device is configured to actively adjust, in an adjustment state, a position and/or an orientation of the optical unit with respect to the support structure in N degrees of freedom. The actuator device includes an active first actuator component and an active second actuator component.

The first actuator component is configured to act on the optical element unit at a first location to generate a first excursion of the optical element unit in a first degree of freedom of the N degrees of freedom. The second actuator component is configured to act on the optical element unit at a second location to generate a second excursion of the optical element unit in a second degree of freedom of the N degrees of freedom, the second location being located at a distance from the first location and the second degree of freedom being different from the first degree of freedom. The second actuator component, at the first excursion, undergoes an elastic deflection generating a parasitic residual load introduced into the optical element unit at the second location. The actuator device includes a third actuator component, wherein the third actuator component is configured to act on the optical element unit at the second location. Furthermore, the third actuator component is configured to at least partially compensate, in a parasitic residual load compensation state, the parasitic residual load introduced into the optical element unit. As it had already been outlined above, with such a solution, compensation of the parasitic residual load is provided in a beneficial way in the same area in which the parasitic residual load would otherwise be introduced into the optical element unit.

Hence, the introduction of stresses resulting from the parasitic load and the compensating load, respectively, into the optical element unit may be at least largely avoided. With such an arrangement, the objects, variants and advantages as outlined above may be achieved to the same extent, such that insofar explicit reference is made to the statements made in the foregoing.

According to a third aspect, the present disclosure relates to a method of supporting an optical element unit, wherein an actuator device is connected to the optical element unit and to a support structure for supporting the optical unit, and the actuator device, in an adjustment step, actively adjusts a position and/or an orientation of the optical unit with respect to the support structure in N degrees of freedom. The actuator device, in at least one of the N degrees of freedom, supports the optical element unit in a statically overdetermined manner via a plurality of active first and second actuator components such that, in a holding step following the adjustment step, the first and second actuator components cause a parasitic residual load introduced into the optical element unit in the at least one of the N degrees of freedom. Furthermore, an active third actuator component of the actuator device, in a parasitic residual load compensation step, at least partially compensates the parasitic residual load introduced into the optical element unit in the at least one of the N degrees of freedom. With this method, the objects, variants and advantages as outlined above in the context of the optical imaging arrangement according to the present disclosure may be achieved to the same extent, such that insofar explicit reference is made to the statements made in the foregoing.

According to a fourth aspect, the present disclosure relates to a method of supporting an optical element unit, wherein an actuator device is connected to the optical element unit and to a support structure for supporting the optical unit. The actuator device, in an adjustment step, actively adjusts a position and/or an orientation of the optical unit with respect to the support structure in N degrees of freedom. A first actuator component of the actuator device acts on the optical element unit at a first location to generate a first excursion of the optical element unit in a first degree of freedom of the N degrees of freedom. A second actuator component of the actuator device acts on the optical element unit at a second location to generate a second excursion of the optical element unit in a second degree of freedom of the N degrees of freedom, the second location being located at a distance from the first location and the second degree of freedom being different from the first degree of freedom. The second actuator component, at the first excursion, undergoes an elastic deflection generating a parasitic residual load introduced into the optical element unit at the second location. A third actuator component of the actuator device acts on the optical element unit at the second location to at least partially compensate, in a parasitic residual load compensation step, the parasitic residual load introduced into the optical element unit. With this method, the objects, variants and advantages as outlined above in the context of the optical imaging arrangement according to the present disclosure may be achieved to the same extent, such that insofar explicit reference is made to the statements made in the foregoing.

Finally, according to a fifth aspect, the present disclosure relates to an optical imaging method, wherein in an exposure process using exposure light, an image of a pattern is transferred, onto a substrate using an optical imaging arrangement according to the present disclosure. Preferably, during the exposure process, a deformation and/or an orientation and/or a position of the optical element body of the optical imaging arrangement is actively adjusted in at least one degree of freedom up to all six degrees of freedom in space using a method according to the present disclosure. With this method as well, the objects, variants and advantages as outlined above in the context of the optical imaging arrangements according to the present disclosure may be achieved to the same extent, such that insofar explicit reference is made to the statements made in the foregoing.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

BRIEF DESCRIPTION OF THE DRAWINGS

FIG. 2 is a schematic perspective top view of a part of the optical imaging arrangement of FIG. 1.

FIG. 3 is a schematic perspective top view of a part of the optical imaging arrangement of FIG. 2.

FIG. 4 is a schematic partially sectional view of a part of the optical imaging arrangement of FIG. 2.

FIG. 9 is a schematic perspective top view of a part of a further preferred embodiment of an optical imaging arrangement according to the disclosure with which preferred embodiments of methods according to the disclosure may be executed.

FIG. 10 is a schematic perspective top view of a part of the optical imaging arrangement of FIG. 2.

FIG. 11 is a schematic perspective top view of a part of a further preferred embodiment of an optical imaging arrangement according to the disclosure with which preferred embodiments of methods according to the disclosure may be executed.

FIG. 12 is a block diagram of a preferred embodiment of an optical imaging method according to the disclosure including preferred embodiments of the further methods according to the disclosure which may be executed with the optical imaging arrangement of FIG. 1.

DETAILED DESCRIPTION OF THE DISCLOSURE

First Embodiment

In the following, a first preferred embodiment of an optical imaging arrangement 101 according to the disclosure with which preferred embodiments of methods according to the disclosure may be executed will be described with reference to FIGS. 1 to 4 and 12.

To facilitate understanding of the following explanations an xyz coordinate system is introduced in the Figures, wherein the z-direction designates the vertical direction (i.e. the direction of gravity). It will however be appreciated that, with other embodiments of the disclosure, any other orientation of the components in space may be selected.

Figure 1:
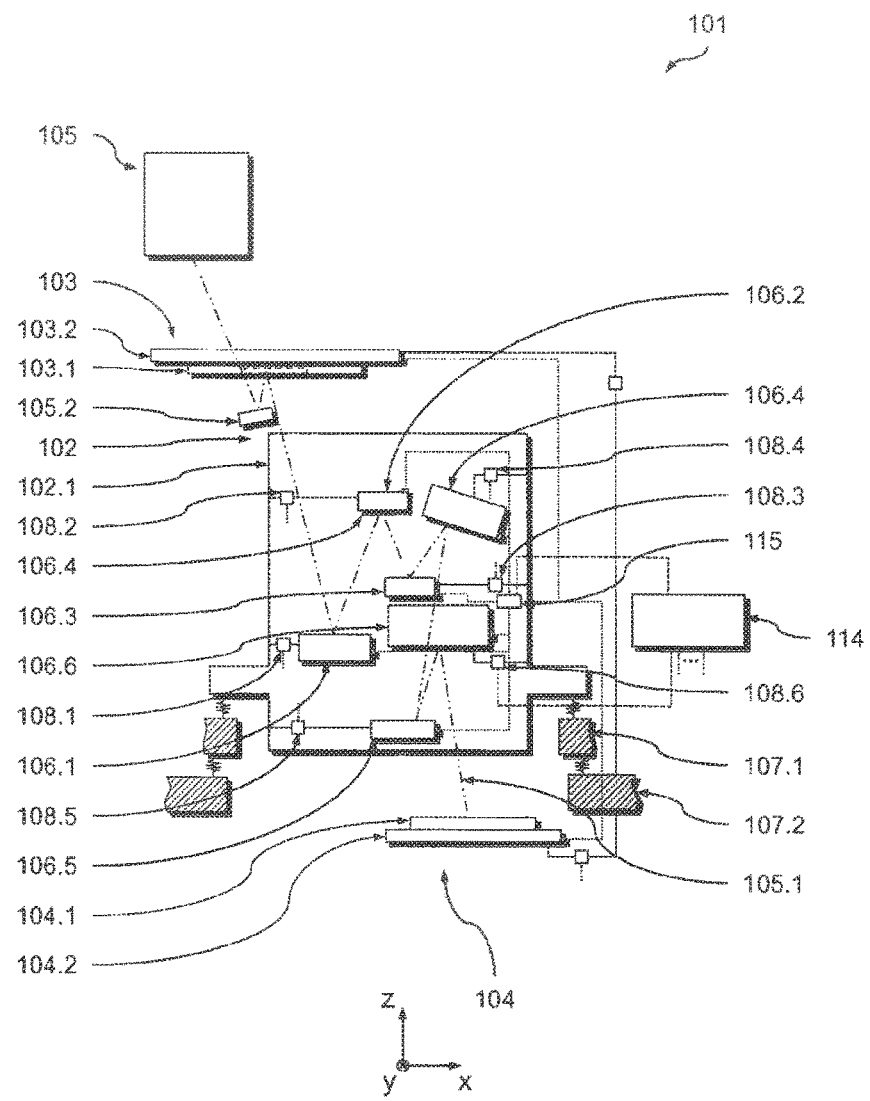
FIG. 1 is a schematic representation of a preferred embodiment of an optical imaging arrangement according to the disclosure with which preferred embodiments of methods according to the disclosure may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 includes an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 with exposure light (represented by its chief ray 105.1) via an appropriate light guide system 105.2. The optical projection unit 102 receives the light reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even (light and/or fluid) tight enclosure of the optical element unit group 106. Rather it may also be partially formed as an open structure as it is the case with the present example.

It will be appreciated that, in the sense of the present disclosure, an optical element unit may merely consist of an optical element, such as a mirror. However, such an optical element unit may also include further components such as a holder holding such an optical element.

The projection optics box structure 102.1 is supported in a vibration isolated manner on a load bearing structure 107.1, which in turn, is supported on a ground or base structure 107.2. The load bearing structure 107.1 is supported on the ground or base structure 107.2 in a vibration isolated manner at a vibration isolation resonant frequency that ranges from 0.05 Hz to 8.0 Hz, preferably from 0.1 Hz to 1.0 Hz, more preferably from 0.2 Hz to 0.6 Hz. Furthermore, typically, a damping ratio is selected that ranges from 5% to 60%, preferably from 10% to 30%, more preferably from 20% to 25%. In the present example a vibration isolation resonant frequency of 0.25 Hz to 2 Hz at a damping ratio of 15% to 35% is selected for the vibration isolated support of the load bearing structure 107.

The ground or base structure 107.2 (in a vibration isolated manner) also supports the mask table 103.2 via a mask table support device 103.3 and the substrate table 104.2 via a substrate table support device 104.3. It will be appreciated however that, with other embodiments of the disclosure, the load bearing structure 107.1 may also support (preferably in a vibration isolated manner) the mask table 103.2 and the substrate table 104.2.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 includes a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 includes an optical element in the form of a mirror, also referred to as mirrors M1 to M6 in the following.

It will be further appreciated that, with other embodiments of the disclosure, another number of optical element units may be used. Preferably, four to eight optical element units are provided.

Each one of the optical element units 106.1 (M1) to 106.6 (M6) is supported on the support structure formed by the projection optics box structure 102.1 by an associated support device 108.1 to 108.6. In the present embodiment, at least one of the mirrors 106.1 to 106.6 is supported by its associated support device 108.1 to 108.6 in a so-called semi-active manner on the projection optics box structure 102.1. It will be appreciated that eventually all the mirrors 106.1 to 106.6 may be supported in such a semi-active manner on the projection optics box structure 102.1. However, for individual mirrors a different support concept may be selected. For example, some of the optical element units may be supported in an active manner as it has been outlined above, while in addition or as alternative, optical element units may be only supported in a passive manner.

As can be seen from FIG. 2, the first mirror 106.1 is supported in such a semi-active manner via the support device 108.1, which is formed as such a semi-active actuator device. To this end, the optical element unit 106.1, including mirror M1 (shown as a transparent component in FIG. 2) and its holder 109.1, is supported on the support structure 102.1 via three actuator units 110.1 to 110.3 of the actuator device 108.1.

As can be seen from FIG. 2, in the present embodiment, the actuator units 110.1 to 110.3 are mutually substantially evenly spaced and, hence, substantially evenly distributed along the circumference of the optical element unit 106.1. It will, however, be appreciated that, with other embodiments, any other desired and suitable distribution of the actuator units 110.1 to 110.3 may be selected. Moreover, a different number of actuator units may be used. For example, with certain embodiments, only two such actuator units may be sufficient, whereas with further embodiments, more than three such actuator units may be used.

In the present example, the three actuator units 110.1 to 110.3 are of substantially identical design. It will, however, be appreciated that, with other embodiments of the disclosure, one or more of the actuator units may be of different design. In particular, they may operate according to different operating principles.

The actuator device 108.1 is configured to actively adjust, in an adjustment state, a position and/or an orientation of the optical unit 106.1 with respect to the support structure 102.1 in N degrees of freedom. It will be appreciated that the active adjustment may be provided in any desired number of degrees of freedom. The present example, active adjustment is provided in all six degrees of freedom in space (i.e. N=6).

With other embodiments, however, active adjustment may be limited to those degrees of freedom, in which a noticeable sensitivity of the imaging accuracy of the optical imaging process (performed with the optical imaging system 101) exists. Hence, in some cases, active adjustment is provided in all six degrees of freedom, while in other cases, the only individual degrees of freedom involve such an active adjustment. In many cases, for example, with the optical elements having an optical surface with an axis of rotational symmetry, the rotational degree of freedom about this axis of rotational symmetry is of minor relevance. Hence, active adjustment about this rotational degree of freedom may be omitted.

In the present example, the actuator device 108.1 is configured to support the optical element unit 106.1 in a statically overdetermined manner in at least one of the N degrees of freedom. To this end, as can be seen from FIGS. 2 to 4, each actuator unit 110.1 to 110.3 includes a first actuator element 111.1, a second actuator element 111.2 and a third actuator element 111.3. As can be seen from FIG. 3 (showing by way of example the first actuator unit 110.1 in greater detail), the first actuator element 111.1 is configured to provide actuation in a first direction of actuation 112.1, the second actuator element 111.2 is configured to provide actuation in a second direction of actuation 112.2, and the third actuator element 111.3 is configured to provide actuation in a third direction of actuation 112.3. Herein, the first, second and third directions of actuation 112.1 to 112.3 of the respective actuator element 111.1 to 111.3 are mutually inclined with respect to each other.

Moreover, the first actuator element 111.1 and the second actuator element 111.2 of the respective actuator unit 110.1 to 110.3 are arranged in the manner of a bipod (i.e. in a kinematically parallel arrangement), wherein the bipod planes (defined by the respective first and second direction of actuation 112.1 and 112.3) are mutually inclined with respect to each other. Hence, overall, these six (first and second) actuator elements 111.1 and 111.2 are arranged in the manner of a conventional hexapod support structure.

On the other hand, statically overdetermined support is provided in that the first, second and third actuator elements 111.1 to 111.3 of each actuator unit 110.1 to 110.3 are arranged in the manner of a tripod (i.e. also in a kinematically parallel arrangement).

It will be appreciated that FIGS. 2 to 4 only give a schematic representation of the respective actuator unit 110.1 to 110.3. In particular, functional principle of the actuator elements 111.1 to 111.3 is not shown in greater detail but merely represented by their respective direction of actuation 112.1 to 112.3. In the present example, each actuator element 111.1 to 111.3 is formed as a so-called semi-active linear displacement actuator including one or more piezoelectric elements generating a defined translational displacement along the respective direction of actuation 112.1 to 112.3 as a function of a defined input signal. To this end, the motion generated by the respective piezoelectric element may be converted into the respective motion in the direction of actuation via suitable lever and linkage arrangements. Such lever and linkage arrangements are sufficiently well known in the art, such that they will not be described in further detail herein.

It will be appreciated that, with other embodiments, any other desired and suitable type of actuator may be selected for the respective actuator unit 110.1 to 110.3. In particular rotational actuators providing a rotational motion as a function of a defined input signal may be selected.

As will be apparent from FIGS. 2 and 4, in the present embodiment, the first and second actuator elements 111.1 and 111.2 of the second and third actuator units 110.2 and 110.3, form an active first actuator component AC1 in the sense of the present disclosure, while the first and second actuator elements 111.1 and 111.2 of the first actuator unit 110.1 form an active second actuator component AC2 in the sense of the present disclosure.

This active first actuator component AC1 (actuator elements 111.1 and 111.2 of the second and third actuator units 110.2 and 110.3), in an adjustment state, under the control of a control unit 114, acts on the optical element unit 106.1 at a first location L1 (namely the location where actuator units 110.2 and 110.3 contact the optical element unit 106.1) to generate a first excursion OE1 of the optical element unit 106.1 from its neutral position (indicated in FIG. 4 by the dashed contour 113) in at least one first degree of freedom DOF1 of the N degrees of freedom. In the situation shown in FIG. 4, this first degree of freedom is the translational degree of freedom along the x-axis.

The active second actuator component AC2 (formed by actuator elements 111.1 and 111.2 of the first actuator unit 110.1), on the other hand, is configured to act on the optical element unit 106.1 at a second location L2 to generate, under the control of the control unit 114, a second excursion OE2 (not shown) of the optical element unit 106.1 in at least one second degree of freedom DOF2 of the N degrees of freedom (more precisely an excursion in the xy-plane), which is different from the first degree of freedom DOF1.

As can be seen from FIG. 4, at the first excursion OE1, the actuator elements 111.1 and 111.2 of the first actuator unit 110.1 (forming the second actuator component AC2) undergo an elastic deflection. In a holding state maintaining this first excursion OE1, this elastic deflection would result in an elastic resetting load RL (schematically represented in FIG. 4 by an elastic resetting force RL).

The elastic resetting force RF acts on the optical element unit 106.1 at the second location L2 and, unless counteracted, generates a parasitic residual load PRL within the optical element unit 106.1. This parasitic residual load is schematically represented in FIG. 4 by a parasitic residual force PRL.

To compensate this parasitic residual load PRL, the third actuator element 111.3 of the first actuator unit 110.1 forms a third actuator component AC3 in the sense of the present disclosure. The third actuator element 111.3 of the first actuator unit 110.1 (i.e. the third actuator component AC3), under the control of control unit 114, not only follows the excursion of the optical element unit 106.1 but also acts on the optical element unit 106.1 at the second location L2 to at least partially compensate (preferably substantially fully compensate) the parasitic residual load PRL via a compensation load CL (schematically represented in FIG. 4 by a compensation force CL) introduced into the optical element unit 106.1.

Hence, in other words, compensation of the parasitic residual load PRL is provided in a beneficial way in the same area L2 in which the parasitic residual load PRL would otherwise be introduced into the optical element unit. Hence, the introduction of stresses resulting from the parasitic load PRL and the compensating load CL, respectively, into the optical element unit 106.1 may be at least largely avoided.

It will be appreciated that the control unit 114 executes the control of the actuator units 110.1 to 110.3 in a closed loop control as a function of measurement signals MS received from a measurement device 115 of the optical imaging apparatus. In particular, it may be provided that one or more of the piezoelectric elements of the respective actuator element 111.1 to 111.3 are also used in a sensor mode as a parasitic load sensor device forming part of this measurement device 115 to capture and provide measurement signals MS representing parasitic residual load information PRLI representative of the parasitic load PRL actually acting at the respective interface to the optical element unit 106.1 in the respective degree of freedom of interest. This parasitic residual load information PRLI is then processed in the control unit 114 to provide corresponding parasitic residual load compensating control of the actuator units 110.1 to 110.3 as it has described above.

It will be appreciated that, with certain embodiments, separate parasitic load sensor devices may also be provided (in addition or as alternative) as it is schematically indicated by the dashed contour 115.1 in FIG. 4. Such a parasitic load sensor 115.1 may, for example, be formed by a simple load cell and/or a force sensor and/or a deformation sensor or the like providing corresponding parasitic residual load information PRLI to the control unit 114. Again, such a parasitic load sensor device 115.1 preferably captures the parasitic residual load information PRLI in the area of the location (e.g. the second location L2), where the respective actuator unit 110.1 to 110.3 is connected to the optical element unit 106.1. By this approach, particularly exact determination of the parasitic residual load PRL may be achieved.

To obtain appropriate control, the parasitic load sensor device may provide the parasitic residual load information to a control device of the actuator device, the control device being configured to control the third actuator component as a function of the parasitic residual load information to at least partially compensate the parasitic residual load. By this approach, particularly simple yet efficient control may be achieved.

It will be appreciated that, with other embodiments, a different control concept may be used for controlling the actuator devices 110.1 to 110.3 to achieve parasitic load compensation. For example, depending on the accuracy of the action of the actuator devices 110.1 to 110.3 it may even be possible to implement an open loop control to provide the adjustments for such parasitic load compensation.

It will be appreciated that, with certain embodiments, the compensation load CL can also be introduced at a different location (other than the second location L2). This, however, would lead to parasitic residual stress PRS present in the area between the second location L2 and the location of introduction of the compensation load CL. Nevertheless, if this area affected by such parasitic residual stress PRS is not critical to the optical imaging error of the optical imaging process to be performed with the optical imaging apparatus 101, such a solution may be acceptable.

It will be further appreciated that the magnitude of the elastic resetting load RL (and the parasitic residual load PRL resulting therefrom unless counteracted) largely depends on the design of the first actuator unit 110.1 and its interface with the optical element unit 106.1 and the support structure 102.1, respectively. With conventional designs, this design is selected such that it generates as low resetting loads RL as possible. However, under dynamic aspects, such a design has the disadvantage that the resonant frequencies of the support of the optical element unit are comparatively low and, hence, the optical element unit, in an undesired way, is eventually highly susceptible to vibration disturbances introduced into the optical element unit.

In the present example, nevertheless a similar approach is taken, in that the actuator units 110.1 to 110.2 are connected to the optical element unit 106.1 and the support structure 102.1, respectively, via a plurality of decoupling links (not shown in greater detail) at the respective first and second end of the actuator unit, which provides proper decoupling in the relevant degrees of freedom, in which, otherwise, high parasitic loads would be generated. Preferably, the decoupling links are formed in the manner of ball joints or cardan joints. By this approach, in particular when linear actuators are used, proper decoupling may be achieved in the degrees of freedom other than the degree of freedom where actuation is provided. The decoupling links may be executed in any desired and suitable way. Preferably, elastic solid body links, also referred to as flexures, are used thanks to their advantages in terms of providing frictionless motion. Hence, generally, in the present embodiment, the level of the elastic resetting loads RL and, hence, the parasitic residual loads PRL is kept beneficially low.

With the present disclosure, the dynamic problem of such a low rigidity support is solved by providing a statically overdetermined active support which, on the one hand, minimizes the parasitic residual load PRL by introducing the compensating load CL as outlined above. On the other hand the statically overdetermined active support, thanks to the static overdetermination, may provide a highly rigid support for the optical element unit 106.1 with comparatively high resonant frequencies, which a highly beneficial under dynamic aspects.

Preferably, the third actuator component AC3 increases a rigidity of the respective actuator device in the respective degree of freedom, e.g. the first degree of freedom DOF1, by a factor of 1.2 to 3, preferably 1.3 to 2, more preferably 1.3 to 1.5. By this approach, particularly beneficial results are achieved at comparatively low expense. Typically, for example, first order resonant frequencies from 100 Hz to 1000 Hz, preferably from 200 Hz to 750 Hz, more preferably from 200 Hz to 500 Hz, may be achieved for the support of the optical element unit 106.1 in the respective degree of freedom (such as, for example, the first degree of freedom DOF1 as described above).

It will be appreciated that the roles as the first, second and third active actuator component AC1 to AC3 may change among the components of the actuator units 110.1 to 110.3 depending on the actual degree of freedom of interest.

With the optical imaging apparatus 101 of FIGS. 1 to 4 a method of transferring an image of a pattern onto a substrate may be executed using a preferred embodiment of the method of supporting an optical element unit according to the disclosure as it will be described in the following with reference to FIGS. 1 to 4 and 12.

In a transferring step of this method, an image of the pattern formed on the mask 103.1 is transferred onto the substrate 104.1 using the optical projection unit 102 of the optical imaging arrangement 101, which have been provided in a step S1 in the configuration as outlined above. In a step S2, the optical element unit 106.1 has been supported and deflected, in an adjustment step (i.e. in an adjustment state), to yield the excursion OE1 as it has been outlined above.

Furthermore, in a capturing step S3 performed before and/or during the transferring step, the parasitic residual load information PRLI is captured as it has been outlined above.

In a parasitic residual load compensation step S4 performed before and/or during the transferring step, the control unit 114 uses the parasitic residual load information PRLI to control the respective actuator unit 110.1 to 110.3 to provide compensation of the parasitic residual load PRL as it has been described above. In an exposure step, immediately following or eventually overlapping the controlling step S4, the image of the pattern formed on the mask 103.1 is then exposed onto the substrate 104.1 using the optical imaging arrangement 101.

Second Embodiment

With reference to FIGS. 1, 5 to 8 and 12 a further preferred embodiment of an optical imaging arrangement 201 according to the disclosure with which preferred embodiments of methods according to the disclosure may be executed will now be described in greater detail. The optical imaging arrangement 201, in its basic design and functionality, largely corresponds to the optical imaging arrangement 101, such that it will be mainly referred to the differences only. The only difference lies within the actuator device 208.1 supporting the optical element unit 106.1, which may replace the actuator device 108.1 in the optical imaging apparatus 101 of FIG. 1. Hence, identical or like components are given the same reference numerals increased by 100. Unless deviating explanations are given in the following it is here explicitly referred to the explanations given above with respect to the features and functions of these components.

As can be seen from FIGS. 5 to 8, each showing a view similar to the view of FIG. 4, the respective actuator units 210.1, 210.2 and 210.3 simply replace actuator units 110.1 to 110.3 (as shown in FIG. 2) and only include the first and second actuator elements 111.1 and 111.2 in the configuration the arrangement as outlined above in the context of the first embodiment. Hence, insofar explicit reference is made to the explanations given above.

In the present example, the third actuator element 110.3 of the first embodiment is replaced by a parasitic residual load compensation unit 210.3 forming the third actuator component AC3 to provide the desired parasitic residual load compensation. The compensation unit 210.3 includes a connecting element 216.1 and an active locking unit 216.2. The connecting element 216.1 is connected to the optical element unit 106.1 at the location L2, i.e. in the area of its interface with the respective first and second actuator element 111.1 and 111.2.

The locking unit 216.2 is connected to the support structure 102.1. The locking unit 216.2 is further configured to interact with the connecting elements 216.1 to selectively release the connecting element 216.1 for displacement in a released state and to lock the connecting element 216.1 against displacement in a locked state.

Figure 5:
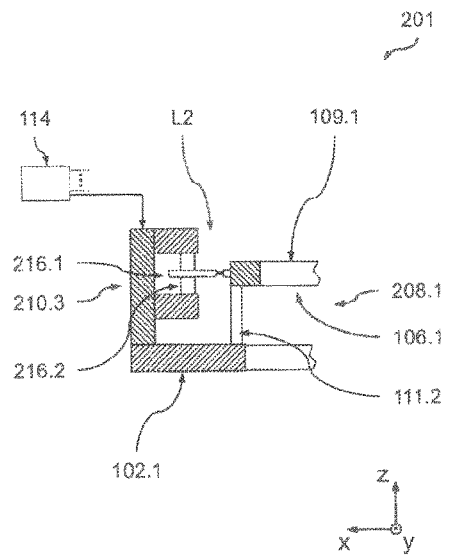
FIG. 5 is a schematic partially sectional view of a further preferred embodiment of an optical imaging arrangement according to the disclosure in a first state with which preferred embodiments of methods according to the disclosure may be executed.

The control unit 114 controls the locking unit 216.2 such that the connecting elements 216.1, in an initial, neutral state of the optical element unit 106.1 as shown in FIG. 5, the locking unit 216.2 locks the connecting element 216.1 against displacement in the first degree of freedom DOF1. By this approach, in a very simple manner, a highly rigid support for the optical element unit 106.1 is achieved in this first degree of freedom DOF1.

Figure 6:
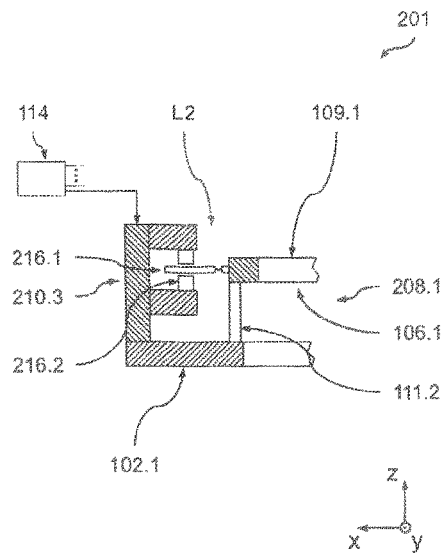
FIG. 6 is a schematic partially sectional view of the part of the optical imaging arrangement of FIG. 5 in a second state.
Figure 7:
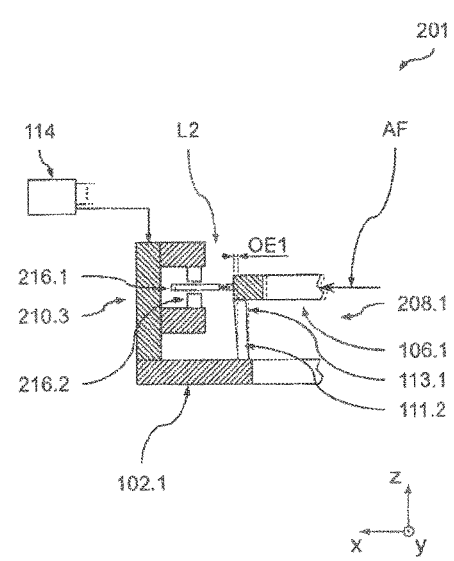
FIG. 7 is a schematic partially sectional view of the part of the optical imaging arrangement of FIG. 5 in a third state.

As shown in FIG. 6, for the adjustment step, the control unit 114 puts the locking unit 216.2 in a second, unlocked state. In this unlocked state, the first and second actuator elements 111.1 and 111.2 of the second and third actuator units 210.2 and 210.3 apply and actuation force AF to the optical element unit 106.1, thereby generating the excursion OE1 of the optical element units 106.1 in the first degree of freedom DOF1 as shown in FIG. 7.

Figure 8:
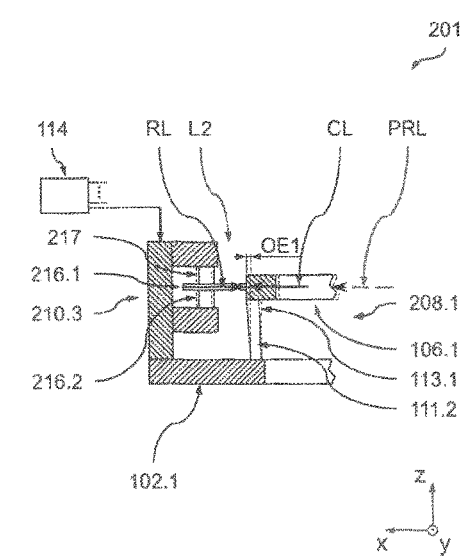
FIG. 8 is a schematic partially sectional view of the part of the optical imaging arrangement of FIG. 5 in a fourth state.

At the end of this adjustment step, the control unit 114 again switches the locking unit 216.2 to its locked state. In a subsequent parasitic residual load compensation state as shown in FIG. 8, the connecting element 216.1 is still locked against displacement by the locking unit 216.2. In this parasitic residual load compensation state, the parasitic residual load compensation unit 210.3 again generates a compensating load CL by elastic deformation of parts of the parasitic residual load compensation unit 210.3 (e.g. of the connecting elements 216.1 and/or the locking unit 216.2). This compensating load again compensates the resetting load RL resulting from the elastic deflection of the first and second actuator elements 110.1, 110.2. Hence, here as well, at least partial compensation, preferably full compensation of this resetting load RL is achieved leading to minimization of the parasitic residual load PRL acting on the optical element unit 106.1 (eventually even down to zero).

The present solution has the great advantage that the third actuator component AC3 formed by the parasitic residual load compensation unit 210.3 may be designed as a fairly simple component, which, in particular, doesn't require a large range of actuation motion. In particular, the range of actuation motion may be way smaller than the range of actuation of the first and second actuator components (actually generating the motion of the optical element unit 106.1). In particular, the range of actuation motion of the third actuator component AC3 formed by the parasitic residual load compensation unit 210.3 only needs to ensure proper locking and unlocking of the locking unit 216.2.

Moreover, control of the third actuator component AC3 formed by the parasitic residual load compensation unit 210.3, more precisely, control of the locking unit 216.2 by the control unit 114, only has to be synchronized to the control of the first and second actuator component generating the actuating force AF as regards the locking and unlocking of the locking unit 216.2. During the adjustment state, control of the (then unlocked) locking unit 216.2 may be inactive. Hence, control of the third actuator component AC3 may be a simple switching on and off, respectively, of the locking unit 216.2, which only has to be sufficiently well synchronized to the beginning and end of the adjustment state.

It will be appreciated that the elastic deformation of the third actuator component AC3 formed by the residual load compensation unit 210.3, which results in the compensating load CL, may be achieved in at least one of two ways. A first option is to apply a certain over-actuation DOE1 of the second and third actuator units 210.2 and 210.3 that apply the actuation force AF to the optical element unit 106.1, thereby achieving an excursion of the optical element unit 106.1 beyond the setpoint adjustment, i.e. beyond the setpoint excursion OE1 (i.e generating a total excursion of OE1+DOE1). Then, the locking device 216.2 is locked and, subsequently, the over-actuation DOE1 is removed, such that the optical element unit 106.1 returns to the setpoint excursion OE1. During this return to the setpoint adjustment OE1, the locked locking unit 216.2 and/or the connecting element 216.1 are then elastically deformed to build up the compensating load CL. As outlined above, the amount of over-actuation DOE1 is selected as a function of the rigidity of the parasitic residual load compensation unit 210.3 in the direction of over-actuation. Hence, the higher this rigidity the smaller the amount of over-actuation DOE1 has to be.

A second option for generating the elastic deformation resulting in the compensating load CL is that a part of the parasitic residual load compensation unit 210.3, e.g. the locking unit 216.2 and/or the connecting element 216.1 is configured to generate, in the locked state, a compensation load CL transmitted via the connecting element 216.1 to at least partially compensate the resetting load RL to minimize the parasitic residual load PRL. For example, the locking unit 216.2 may be an active device which, under the control of the control unit 114, actively generates the compensation load CL. To this end, for example, the locking unit (in its locked state) may be configured to apply the elastic deformation to the connecting element 216.1 as it is indicated by the dashed contours 217 in FIG. 8. Here as well, as a function of the rigidity of the parasitic residual load compensation unit 210.3 in the direction of actuation, only a comparatively small range of actuation may be desirable to generate the compensating load CL.

It will be appreciated that, with this embodiment as well, the methods as outlined in the context of the first embodiment with reference to FIG. 12 may be executed to the same extent. Hence, in so far reference is made to the explanations given above in the context of FIG. 12.

Third Embodiment

With reference to FIGS. 1, 9, 10 and 12 a further preferred embodiment of an optical imaging arrangement 301 according to the disclosure with which preferred embodiments of methods according to the disclosure may be executed will now be described in greater detail. The optical imaging arrangement 301, in its basic design and functionality, largely corresponds to the optical imaging arrangement 101, such that it will be mainly referred to the differences only. The only difference lies within the actuator device 308.1 supporting the optical element unit 106.1, which may replace the actuator device 108.1 in the optical imaging apparatus 101 of FIG. 1. Hence, identical or like components are given the same reference numerals increased by 200. Unless deviating explanations are given in the following it is here explicitly referred to the explanations given above with respect to the features and functions of these components.

As can be seen from FIG. 9 (showing a view similar to the one of FIG. 2) and 10 (showing a view of one of the actuator units, namely actuator unit 310.2), the major difference between the first embodiment and the present third embodiment is the specific design of the actuator units 310.1 to 310.3 of the actuator device 308.1 supporting the optical elements unit 106.1 (of which only the holding ring 109.1 is shown in FIG. 9 for better visibility).

More precisely, each of the actuator units 310.1 to 310.3 again is designed in the manner of a tripod, each including a first actuator element 311.1 with a first direction of actuation 312.1, a second actuator element 311.2 with a second direction of actuation 312.2, and a third actuator element 311.3 with a third direction of actuation 312.3 arranged in a kinematically parallel configuration (i.e. in a so-called closed kinematic chain arrangement between the first end and the second end of the respective actuator unit 310.1 to 310.3). Furthermore, the first, second and third directions of actuation 312.1 to 312.3 of the respective actuator unit 310.1 to 310.3 are mutually perpendicular, i.e. form an orthogonal system.

With the present embodiment, however, the first directions of actuation 312.1 of all three actuator elements 311.1 to 311.3 are mutually parallel. Similarly, all second directions of actuation 312.2 are mutually parallel as well as all third directions of actuation 312.3 are mutually parallel. By this approach, in a very simple manner, the respective direction of actuation 312.1 to 312.3 may be assigned to specific degrees of freedom DOF, in which the optical element unit 106.1 has to be adjusted.

Such a solution has the advantage that the parallel directions of actuation 312.1, 312.2 and 312.3, respectively, define a degree of freedom of actuation of the optical element unit 106.1, actuation in which (if at all) involves only minimum parasitic motion in other degrees of freedom, which otherwise would lead to parasitic deformation at the interface between the respective actuator unit 310.1 to 310.3 and the optical element unit 106.1 and, ultimately, to the introduction of parasitic loads into the optical element unit 106.1. For example, translational motion introduced into the optical element unit 106.1 by the three actuator units 310.1 to 310.3 (under the control of the control unit 114) in the respective parallel directions of actuation 312.1, 312.2 and 312.3, respectively, in a beneficial manner (if at all) will only result in minimum parasitic rotation of the optical element unit 106.1 in the respective plane defined by any two of the parallel directions of actuation. Hence, ultimately, with all three sets of mutually parallel directions of actuation, overall parasitic motion in other degrees of freedom (than the ones defined by the respective pairs of directions of actuation) may be minimized. This in a beneficial manner also minimizes parasitic load exerted on the optical element unit 106.1 due to such parasitic motions.

More precisely, in the present case, a three-dimensional (more precisely cubic) motion space is defined by the actuator units 310.1 to 310.3, in which purely translational motion in all three translational degrees of freedom may be executed at minimized parasitic rotational motion about the rotational degrees of freedom.

As can be seen from FIG. 10, the respective connection of the actuator elements 311.1 to 311.3 of the respective actuator unit 310.1 to 310.3 to the optical element unit 106.1 and the support structure 102.1, respectively, again takes place via decoupling links 318 at the first and second end to which, to provide proper decoupling in the relevant degrees of freedom, in which, otherwise, parasitic loads would be generated. As can be seen in a schematic way from FIG. 10, the present example, the respective decoupling link 318 is formed in the manner of a cardan joint. By this approach, in particular when linear actuator elements are used (as in the present case), proper decoupling may be achieved in the degrees of freedom other than the degree of freedom where actuation is provided.

It will be appreciated that the respective decoupling link 318 may be executed in any desired and suitable way. Preferably, elastic solid body links, also referred to as flexures, are used for the decoupling links 318 thanks to their advantages in terms of providing frictionless motion.

Apart from these differences, the design and functionality of the optical imaging arrangement 301 corresponds to the optical imaging arrangement 101, such that reference is insofar made to the explanations given above. In particular, here again, the methods as outlined in the context of the first embodiment with reference to FIG. 12 may be executed to the same extent. Hence, here as well reference is made to the explanations given above in the context of FIG. 12.

Fourth Embodiment

With reference to FIGS. 1, 11 and 12 a further preferred embodiment of an optical imaging arrangement 401 according to the disclosure with which preferred embodiments of methods according to the disclosure may be executed will now be described in greater detail. The optical imaging arrangement 401, in its basic design and functionality, largely corresponds to the optical imaging arrangement 301, such that it will be mainly referred to the differences only. The only difference lies within the actuator device 408.1 supporting the optical element unit 106.1, which again may replace the actuator device 108.1 in the optical imaging apparatus 101 of FIG. 1. Hence, identical or like components are given the same reference numerals increased by 100 (with respect to the third embodiment) or by 300 (with respect to the first embodiment). Unless deviating explanations are given in the following it is here explicitly referred to the explanations given above with respect to the features and functions of these components.

As can be seen from FIG. 11 (showing a view similar to the one of FIG. 10), the major difference between the third embodiment and the present fourth embodiment is the specific design of the actuator units 410.1 to 410.3 of the actuator device 408.1 supporting the optical element unit 106.1. More precisely, in the present embodiment, rather than providing a kinematically parallel arrangement of the individual actuator elements, a kinematically serial arrangement (i.e. a so-called open kinematic chain arrangement) is selected between the first and second end of the respective actuator unit 410.1 to 410.3.

More precisely, as can be seen from FIG. 11, the first actuator element 411.1 acts in the first direction of actuation 412.1 between the support structure 102.1 and the second actuator element 411.2. The second actuator element 411.2 acts in the second direction of actuation 412.2 between the first actuator element 411.1 and the third actuator element 411.3. Finally, the third actuator element 411.3 acts in the third direction of actuation 412.3 between the second actuator element 411.2 and the optical element unit 106.1. Actuation in the respective direction of actuation 412.1 to 412.3 again is provided by one or more suitable piezoelectric elements (not shown in greater detail), while motion guidance in the respective degree of freedom is provided by suitable parallel guide linkages, which are represented in a highly schematic way in FIG. 11.

It will be appreciated that the actuator unit 410.1 as shown in FIG. 11 replaces one of the 310.1 to 310.3 as shown in FIG. 9, such that in the present embodiment as well (i.e. similar to the third embodiment), the respective first, second and third directions of actuation 412.1 to 412.3 again form three sets of parallel directions of actuation in the respective three translational degrees of freedom DOF. Hence, here again, a three-dimensional (more precisely cubic) motion space is defined by the actuator units 410.1 to 410.3, in which purely translational motion in all three translational degrees of freedom may be executed at minimized parasitic rotational motion about the rotational degrees of freedom.

As can be seen from FIG. 11, the respective connection of the actuator unit 410.1 to 410.3 to the optical element unit 106.1 again takes place via decoupling links 418 to provide decoupling in the relevant degrees of freedom, in which, otherwise, parasitic loads would be generated. As can be seen in a schematic way from FIG. 11, the present example, the respective decoupling link 418 again is formed in the manner of a cardan joint.

Apart from these differences, the design and functionality of the optical imaging arrangement 401 corresponds to the optical imaging arrangement 301, such that reference is insofar made to the explanations given above. In particular, here again, the methods as outlined in the context of the first embodiment with reference to FIG. 12 may be executed to the same extent. Hence, here as well reference is made to the explanations given above in the context of FIG. 12.

Although in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units. Furthermore, it will be appreciated that the present disclosure, although mainly described in the context of microlithography in the foregoing, may also be used in the context of any other type of optical imaging process, typically involving a comparably high level of imaging accuracy. In particular, the disclosure may be used in the context of any other type of optical imaging process operating at different wavelengths.

What is claimed is:

1. An optical imaging arrangement, comprising:
   an optical element unit; and
   an actuator device connected to the optical element unit, the actuator device configured to be connected to a support structure to support the optical unit,
   wherein:
   the actuator device is configured to actively adjust, in an adjustment state, a position and/or an orientation of the optical unit with respect to the support structure in N degrees of freedom;
   the actuator device is configured to support the optical element unit in a statically overdetermined manner in at least one of the N degrees of freedom via a plurality of active first and second actuator components so that, in a holding state following the adjustment state, the first and second actuator components cause a parasitic residual load introduced into the optical element unit in the at least one of the N degrees of freedom;
   the actuator device comprises an active third actuator component configured to at least partially compensate, in a parasitic residual load compensation state, the parasitic residual load introduced into the optical element unit in the at least one of the N degrees of freedom;
   an active first actuator component of the plurality of first and second actuator components is configured to act on the optical element unit at a first location to generate a first excursion of the optical element unit in at least one first degree of freedom of the N degrees of freedom;
   an active second actuator component of the plurality of first and second actuator components is configured to act on the optical element unit at a second location to generate a second excursion of the optical element unit in at least one second degree of freedom of the N degrees of freedom;
   the second location is located at a distance from the first location;
   the second degree of freedom is different from the first degree of freedom;
   the second actuator component, at the first excursion, undergoes an elastic deflection generating the parasitic residual load introduced into the optical element unit at the second location; and
   the third actuator component is configured to act on the optical element unit at the second location to at least partially compensate the parasitic residual load introduced into the optical element unit.

2. The optical imaging arrangement of claim 1, wherein:
the actuator device comprises at least one actuator unit integrating one of the first and second actuator components and the third actuator component;
the actuator unit has a first end connected to the optical element unit and a second end to be connected to the support structure;
the actuator components of the actuator unit are arranged kinematically in series or kinematically parallel between the first end and the second end of the actuator unit; and
at least one of the following holds:
the actuator unit comprises at least two actuator elements arranged kinematically in series between the first end and the second end of the actuator unit;
the actuator unit comprises at least two actuator elements arranged kinematically parallel between the first end and the second end of the actuator unit;
the actuator unit comprises a first actuator element and a second actuator element forming one of the first and second actuator components;
the actuator unit comprises an actuator element forming the third actuator component; and
the actuator unit comprises at least one decoupling link at the first end and/or the second end, the at least one decoupling link being formed in the manner of a ball joint or a cardan joint.

3. The optical imaging arrangement of claim 2, wherein:
the actuator unit comprises a first actuator element, a second actuator element and a third actuator element;
the first actuator element is configured to provide actuation in a first direction of actuation;
the second actuator element is configured to provide actuation in a second direction of actuation;
the third actuator element is configured to provide actuation in a third direction of actuation;
at least two of the first, second and third directions of actuation are mutually inclined with respect to each other; and
the first actuator element and the second actuator element are arranged in the manner of a bipod forming one of the first and second actuator components, the first, second and third actuator elements being arranged in the manner of a tripod.

4. The optical imaging arrangement of claim 2, wherein:
the actuator device comprises a first actuator unit integrating the first actuator component;
the actuator device comprises a second actuator unit integrating the second actuator component and the third actuator component;
the first and second actuator units are mutually spaced along a circumference of the optical element unit;
each of the first and second actuator units comprises a first actuator element, a second actuator element and a third actuator element;
each of the actuator elements is configured to provide actuation in a direction of actuation; and
in a neutral state, at least one of the following holds:
the directions of actuation of the first actuator elements are at least substantially parallel;
the directions of actuation of the second actuator elements are at least substantially parallel; and
the directions of actuation of the third actuator elements are at least substantially parallel.

5. The optical imaging arrangement according to claim 2, wherein:
the actuator device comprises a first actuator unit, a second actuator unit and a third actuator unit;
the first, second and third actuator units are distributed and mutually spaced along a circumference of the optical element unit;
each of the first, second and third actuator units comprises a first actuator element, a second actuator element and a third actuator element;
each of the actuator elements is configured to provide actuation in a direction of actuation; and
in a neutral state, at least one of the following holds:
the directions of actuation of the first actuator elements are at least substantially parallel;
the directions of actuation of the second actuator elements are at least substantially parallel; and
the directions of actuation of the third actuator elements are at least substantially parallel.

6. The optical imaging arrangement of claim 1, wherein:
the actuator device comprises a first actuator unit, a second actuator unit and a third actuator unit;
the first, second and third actuator units are distributed and mutually spaced along a circumference of the optical element unit;
each of the first, second and third actuator units comprises a first actuator element, a second actuator element and a third actuator element;
the first and second actuator elements of the first, second and third actuator units are configured to support the optical element unit in the manner of a hexapod;
the third actuator elements of the first, second and third actuator units are configured to at least partially compensate parasitic residual loads introduced into the optical element unit as a result of parasitic elastic deflection of the first and second actuator elements; and
the first, second and third actuator elements of at least one of the first, second and third actuator units are arranged in the manner of a tripod.

7. The optical imaging arrangement of claim 1, wherein:
the third actuator component comprises a connecting element and an active locking unit;
the connecting element is connected to the optical element unit and/or one of the first and second actuator components;
the locking unit is configured to be connected to the support structure and to selectively release the connecting element for displacement in a released state and lock the connecting element against displacement in a locked state;
a control device of the actuator device is configured to control the locking unit such that, during the adjustment state, the connecting element is released for displacement, and the connecting element is locked against displacement in the parasitic residual load compensation state;
the locking unit and/or the connecting element is configured to generate, in the locked state, a compensation load transmitted via the connecting element to at least partially compensate the parasitic residual load; and
the control device is configured to control the locking unit and/or the connecting element to generate the compensation load.

8. The optical imaging arrangement of claim 1, wherein:
the actuator device comprises at least one actuator element; and at least one of the following holds:
  the actuator element comprises a displacement actuator generating defined displacement as a function of an input signal;
  the actuator element comprises a linear actuator generating translational motion as a function of an input signal; and
  the actuator element comprises a piezoelectric element.

9. The optical imaging arrangement of claim 1, wherein:
the optical imaging arrangement further comprises a parasitic load sensor device configured to capture parasitic residual load information representative of the parasitic residual load introduced into the optical element unit in the at least one of the N degrees of freedom; and
at least one of the following holds:
  the parasitic load sensor device captures the parasitic residual load information in the area of a location where one of the first and second actuator components is connected to the optical element; and
  the parasitic load sensor device provides the parasitic residual load information to a control device of the actuator device, the control device being configured to control the third actuator component as a function of the parasitic residual load information to at least partially compensate the parasitic residual load; and
  the parasitic load sensor device comprises a force sensor and/or a deformation sensor.

10. The optical imaging arrangement according of claim 1, wherein at least one of the following holds:
  the third actuator component increases a rigidity of the actuator device in the at least one of the N degrees of freedom by a factor of 1.2 to 3;
  the actuator device is connected to the support structure to support the optical unit;
  the actuator device is configured to provide semi-active support of the optical unit on the support structure;
  the optical imaging arrangement is configured to be used in microlithography using exposure light at an exposure light wavelength in an EUV range;
  the optical imaging arrangement further comprises an illumination unit, a mask unit, an optical projection unit and a substrate unit;
  the optical element unit comprises an optical element; and
  the at least one of the N degrees of freedom is a translational degree of freedom, wherein N ranges 1 to 6.

11. A method, comprising:
using the optical imaging arrangement of claim 1 in a lithographic exposure process.

12. An optical imaging arrangement, comprising:
an optical element unit; and
an actuator device connected to the optical element unit, the actuator device being configured to be connected to a support structure to support the optical unit,
wherein:
  the actuator device is configured to actively adjust, in an adjustment state, a position and/or an orientation of the optical unit with respect to the support structure in N degrees of freedom;
  the actuator device comprises an active first actuator component and an active second actuator component;
  the first actuator component is configured to act on the optical element unit at a first location to generate a first excursion of the optical element unit in a first degree of freedom of the N degrees of freedom;
  the second actuator component is configured to act on the optical element unit at a second location to generate a second excursion of the optical element unit in a second degree of freedom of the N degrees of freedom;
  the second location is located at a distance from the first location;
  the second degree of freedom is different from the first degree of freedom;
  the second actuator component, at the first excursion, undergoes an elastic deflection generating a parasitic residual load introduced into the optical element unit at the second location;
  the actuator device comprises a third actuator component which is configured to act on the optical element unit at the second location; and
  the third actuator component is configured to at least partially compensate, in a parasitic residual load compensation state, the parasitic residual load introduced into the optical element unit.

13. A method, comprising:
using the optical imaging arrangement of claim 12 in a lithographic exposure process.

14. A method of supporting an optical element unit, wherein:
  an actuator device is connected to the optical element unit and to a support structure for supporting the optical unit;
  in an adjustment step, the actuator device actively adjusts a position and/or an orientation of the optical unit with respect to the support structure in N degrees of freedom;
  the actuator device, in at least one of the N degrees of freedom, supports the optical element unit in a statically overdetermined manner via a plurality of active first and second actuator components such that, in a holding step following the adjustment step, the first and second actuator components cause a parasitic residual load introduced into the optical element unit in the at least one of the N degrees of freedom;
  an active third actuator component of the actuator device, in a parasitic residual load compensation step, at least partially compensates the parasitic residual load introduced into the optical element unit in the at least one of the N degrees of freedom;
  an active first actuator component of the plurality of first and second actuator components acts on the optical element unit at a first location to generate a first excursion of the optical element unit in at least one first degree of freedom of the N degrees of freedom;
  an active second actuator component of the plurality of first and second actuator components acts on the optical element unit at a second location to generate a motion of the optical element unit in at least one second degree of freedom of the N degrees of freedom, the second location being located at a distance from the first location and the second degree of freedom being different from the first degree of freedom;
  the second actuator component, at the first excursion, undergoes an elastic deflection generating the parasitic residual load introduced into the optical element unit at the second location; and
  the third actuator component acts on the optical element unit at the second location to at least partially compensate the parasitic residual load introduced into the optical element unit.

15. The method of claim 14, wherein:
the actuator device comprises at least one actuator unit integrating one of the first and second actuator components and the third actuator component;
a first end of the actuator unit is connected to the optical element unit;
a second end of the actuator unit is connected to the support structure;
the actuator components of the actuator unit are arranged kinematically in series or kinematically parallel between the first end and the second end of the actuator unit; and
at least one of the following holds:
- at least two actuator elements of the actuator unit are arranged kinematically in series between the first end and the second end of the actuator unit;
- at least two actuator elements of the actuator unit are arranged kinematically parallel between the first end and the second end of the actuator unit;
- a first actuator element and a second actuator element of the actuator unit form one of the first and second actuator components;
- an actuator element of the actuator unit forms the third actuator component; and
- at least one decoupling link is formed at the first end and/or the second end of the actuator unit, the at least one decoupling link being formed in the manner of a ball joint or a cardan joint.

16. The method of claim 14, wherein:
a first, second and third actuator unit of the actuator device are distributed and mutually spaced along a circumference of the optical element unit;
each of the first, second and third actuator units comprises a first actuator element, a second actuator element and a third actuator element;
the first and second actuator elements of the first, second and third actuator units support the optical element unit in the manner of a hexapod; and
the third actuator elements of the first, second and third actuator units at least partially compensate parasitic residual loads introduced into the optical element unit as a result of parasitic elastic deflection of the first and second actuator elements.

17. The method of claim 14, wherein:
a connecting element of the third actuator component is connected to the optical element unit and/or one of the first and second actuator components;
a locking unit of the third actuator component is connected to the support structure and selectively releases the connecting element for displacement in a releasing step and locks the connecting element against displacement in a locking step;
the locking unit is controlled so that, during the adjustment step, the connecting element is released for displacement, and the connecting element is locked against displacement in the parasitic residual load compensation step; and
the locking unit is controlled to generate, in the locking step, a compensation load transmitted via the connecting element to at least partially compensate the parasitic residual load.

18. The method of claim 14, wherein:
a parasitic load sensor device captures parasitic residual load information representative of the parasitic residual load introduced into the optical element unit in the at least one of the N degrees of freedom; and
at least one of the following holds:
- the parasitic load sensor device captures the parasitic residual load information in the area of a location where one of the first and second actuator components is connected to the optical element;
- the third actuator component is controlled as a function of the parasitic residual load information to at least partially compensate the parasitic residual load; and
- the parasitic load sensor device comprises a force sensor and/or a deformation sensor.

19. A method of supporting an optical element unit, wherein:
an actuator device is connected to the optical element unit and to a support structure for supporting the optical unit;
the actuator device, in an adjustment step, actively adjusts a position and/or an orientation of the optical unit with respect to the support structure in N degrees of freedom;
a first actuator component of the actuator device acts on the optical element unit at a first location to generate a first excursion of the optical element unit in a first degree of freedom of the N degrees of freedom;
a second actuator component of the actuator device acts on the optical element unit at a second location to generate a second excursion of the optical element unit in a second degree of freedom of the N degrees of freedom;
the second location is located at a distance from the first location;
the second degree of freedom is different from the first degree of freedom;
the second actuator component, at the first excursion, undergoes an elastic deflection generating a parasitic residual load introduced into the optical element unit at the second location; and
a third actuator component of the actuator device acts on the optical element unit at the second location to at least partially compensate, in a parasitic residual load compensation step, the parasitic residual load introduced into the optical element unit.

20. The method of claim 19, wherein an optical imaging unit comprises the optical element unit, and the method further comprises using the optical imaging arrangement in a lithographic exposure process.

* * * * *